United States Patent
Baggen et al.

(10) Patent No.: US 7,459,701 B2
(45) Date of Patent: Dec. 2, 2008

(54) STAGE APPARATUS, LITHOGRAPHIC APPARATUS AND DEVICE MANUFACTURING METHOD

(75) Inventors: Marcel Koenraad Marie Baggen, Nuenen (NL); Dirk-Jan Bijvoet, Eindhoven (NL); Sjoerd Nicolaas Lambertus Donders, s-Hertogenbosch (NL); Jan Frederik Hoogkamp, Breda (NL); Albert Johannes Maria Jansen, Eindhoven (NL); Jan-Jaap Kuit, Veldhoven (NL); Peter Schaap, Eindhoven (NL); Joep Janssen, Son (NL); Hubrecht Bastiaan Jasperse, Middelbeers (NL); Arjan Martin Van Der Wel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 526 days.

(21) Appl. No.: 11/147,465

(22) Filed: Jun. 8, 2005

(65) Prior Publication Data
US 2006/0279721 A1 Dec. 14, 2006

(51) Int. Cl.
*A61N 5/00* (2006.01)
(52) U.S. Cl. ............... 250/492.2; 250/491.1; 250/492.1
(58) Field of Classification Search .............. 250/491.1, 250/492.1–492.3
See application file for complete search history.

(56) References Cited

U.S. PATENT DOCUMENTS

| | | | | |
|---|---|---|---|---|
| 4,335,313 A * | 6/1982 | Kreuzer et al. ................ 378/34 |
| 4,651,009 A * | 3/1987 | Totsuka .................. 250/442.11 |
| 4,825,086 A * | 4/1989 | Mueller .................... 250/491.1 |
| 4,967,088 A * | 10/1990 | Stengl et al. .............. 250/491.1 |
| 5,716,742 A * | 2/1998 | Doran .......................... 430/22 |
| 5,834,786 A * | 11/1998 | White et al. ............ 250/492.21 |
| 6,015,975 A * | 1/2000 | Kawakami et al. ...... 250/492.22 |
| 6,046,459 A * | 4/2000 | Yasutake et al. ......... 250/492.2 |
| 6,359,678 B1 * | 3/2002 | Ota ............... 355/53 |
| 6,462,807 B1 * | 10/2002 | Nishi ........... 355/53 |
| 6,469,773 B1 | 10/2002 | Iwamoto |
| 6,509,953 B1 * | 1/2003 | Saiki et al. .................... 355/53 |
| 6,521,385 B2 * | 2/2003 | Yoshida et al. ................ 430/22 |
| 6,566,661 B1 * | 5/2003 | Mitchell ..................... 250/489 |
| 6,654,100 B2 * | 11/2003 | Yoda ........................... 355/53 |
| 7,015,488 B2 * | 3/2006 | Ishikawa et al. ......... 250/492.1 |
| 7,045,780 B2 * | 5/2006 | Kley ......................... 250/306 |
| 7,138,629 B2 * | 11/2006 | Noji et al. .................... 250/311 |
| 7,327,437 B2 * | 2/2008 | Cox et al. ..................... 355/53 |
| 2002/0070355 A1 * | 6/2002 | Ota ......................... 250/492.2 |
| 2002/0096640 A1 * | 7/2002 | Tanaka ...................... 250/397 |
| 2003/0197841 A1 | 10/2003 | Araki et al. |

* cited by examiner

*Primary Examiner*—Jack I. Berman
*Assistant Examiner*—Andrew Smyth
(74) *Attorney, Agent, or Firm*—Pillsbury Winthrop Shaw Pittman LLP (57) ABSTRACT

A stage apparatus for displacing an object having a substantially flat surface is described. The apparatus includes an object table for supporting the object and a positioning device for displacing the object table in a first direction. The apparatus further includes a clamping device for clamping the object to the object table by a first clamping force, the first clamping force being controlled by an electronic control unit based upon a state of the object.

20 Claims, 8 Drawing Sheets

STAGE APPARATUS, LITHOGRAPHIC APPARATUS AND DEVICE MANUFACTURING METHOD

FIELD

The present invention relates to a stage apparatus, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. In general, a so-called scanner comprises a positioning device for positioning the patterning device and a positioning device for positioning the substrate. Such positioning devices usually comprise one or more linear motors for displacing the patterning device or substrate and an object table for holding the patterning device or substrate. In order to increase the number of substrates exposed per unit of time, more efficient and powerful positioning devices are applied enabling a higher acceleration of the object tables holding the patterning device or substrate. As a consequence of the increased acceleration, inertial forces acting on the object that is held on the object table (e.g. the patterning device or the substrate) are also increasing. A similar increase in inertial force can also be noticed in case a larger substrate or patterning device is desired. A consequence of the increased inertial force, it becomes more and more difficult to hold the patterning device or substrate on the object table. Conventionally, holding the substrate or patterning device is done by friction. A Sufficient level of friction can be applied by the use of vacuum chambers. In case the requirements with respect to acceleration of the object table are more demanding, the application of only a vacuum clamping may not be sufficient. As a result, the patterning device or substrate may slip on the object table resulting in a possible overlay error. Some improvements have been suggested in literature to increase the holding force that holds the patterning device or substrate. Such improvements may encompass the use of additional clamping using electrostatic forces or magnetic forces as indicated in U.S. Pat. No. 6,469,773. Further improvements indicated in U.S. Pat. No. 6,469,773 describe the use of a mechanism comprising a lever and a weight to exert a force on the patterning device during acceleration. Due to the introduction of such a mechanism, an inferior dynamic behavior of the object table may occur. This may result in an increase in settle-time (i.e. the time desired to have the position of the object table within the desired error bandwidth). The mechanism as described may introduce an additional weight to be accelerated by the object table. Thus, it is desirable to provide a higher force to obtain the desired acceleration of the patterning device or substrate. As a consequence, the accuracy of the positioning of the object may become affected.

US 2003/0197841 also describes some possible arrangements to increase the holding force. The described arrangements ensure an increased holding force by increasing the surface that is subject to the vacuum or reduced pressure or by introducing an addition force perpendicular to the surface of the patterning device. With such an arrangement, it may be desirable to have additional space above the patterning device or substrate. Often, this space is not available. Furthermore, increasing the holding force by clamping the object on upper or lower surface or by exerting additional forces along a side or sides of the object may result in an unwanted deformation of the object causing inaccuracies in the projected image.

SUMMARY

According to an embodiment of the present invention there is provided a stage apparatus for displacing an object having a substantially flat surface, comprising
   an object table for supporting the object;
   a positioning device for displacing the object table in a first direction;
   wherein the object table is provided with a clamping device for clamping the object by a first clamping force,
   wherein the first clamping force is controlled by an electronic control unit based upon a state of the object.

According to a further embodiment of the invention, there is provided a lithographic apparatus comprising an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, further comprising a positioning device for displacing the support in a first direction;
   wherein the support is provided with a clamping device for clamping the object by a first clamping force, and wherein the first clamping force is controlled by an electronic control unit based upon a state of the object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
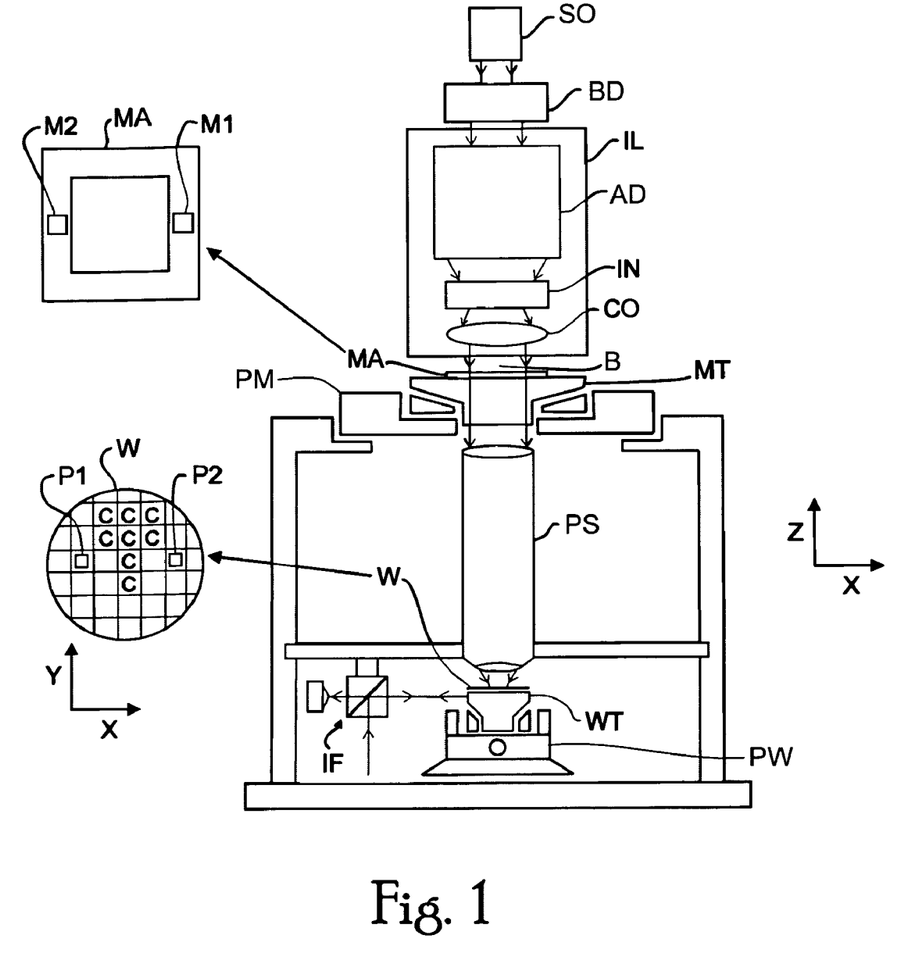
FIG. 1 depicts a lithographic apparatus according to an embodiment of the invention.

FIG. 1 schematically depicts a lithographic apparatus according to one embodiment of the invention. The apparatus comprises:
an illumination system (illuminator) IL configured to condition a radiation beam B (e.g. UV radiation or EUV radiation).
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WT constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if desired, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
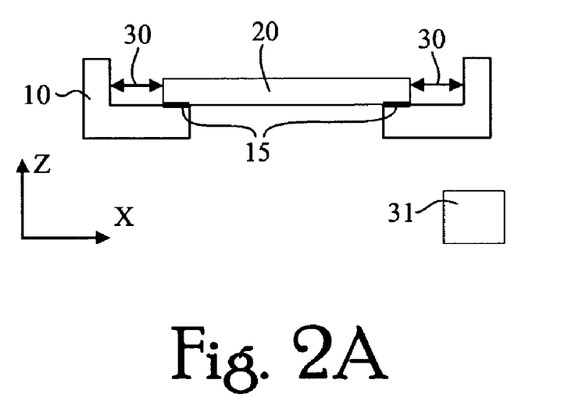
FIGS. 2a and 2b schematically depict a stage apparatus according to the present invention.
Figure 2B:
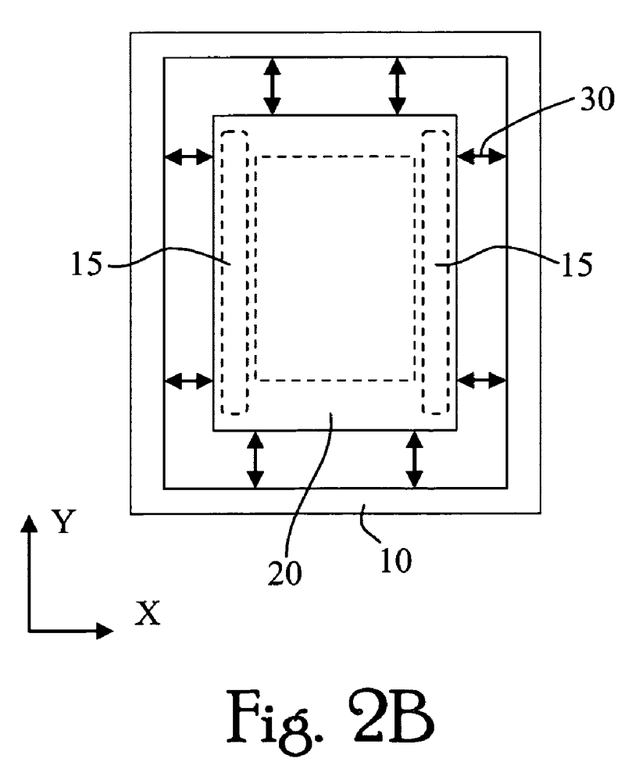

FIGS. 2a and 2b schematically depicts a stage apparatus according to the present invention. The apparatus comprises an object table 10 and a holding device comprising two vacuum pads 15 arranged below an object 20 in order to hold or clamp the object. The object may, as an example, be a reticle provided with a pattern or a substrate. In general, the object table can be driven in 6 degrees of freedom (6DOF) by a positioning device comprising electromagnetic motors and actuators. During acceleration (either positive acceleration or negative acceleration or deceleration) of the object table, the inertial force exerted on the object may tend the object to 'slip'. Due to the friction between the vacuum pads and the object, this inertial force can be countered. At some point, the attractive force of the vacuum pads multiplied with the coefficient of friction may not be sufficient to compensate the inertial force. In order to avoid 'slipping' in these situations, a clamping device is provided. The clamping device is constructed and arranged to clamp the object relative to the object table by a clamping force. The arrows 30 in FIGS. 2a and 2b schematically the exerted clamping force. The clamping device may, as an example, comprise one or more actuators arranged along the circumference of the object to provide the clamping force. The actuators may be arranged to exert a force on the object in a direction substantially parallel to the surface of the object (as indicated by the arrows 30) or in an other direction. By doing so, an additional force component for compensating the inertial force is realized. Alternatively, an additional force can be exerted on the object in a direction substantially perpendicular to the surface of the object.

The apparatus further comprises an electronic control unit 31 for controlling the force exerted on the object. In an embodiment of the present invention, the electronic control unit can be arranged to provide the clamping force only in case the acceleration (either positive or negative) exceeds a certain predefined value. In general, the control unit can be arranged to provide a clamping force that is based upon a state of the object, e.g. the acceleration of the object. As a consequence, the clamping force can substantially be absent in case the object moves at a constant velocity, substantially avoiding deformations of the object. Such an arrangement may be applied in a lithographic apparatus for accelerating e.g. a patterning device such as a reticle in a so-called scanner arrangement. As such, the controlled actuator force can at least compensate a portion of the inertial force during acceleration, enabling a higher acceleration of the reticle while substantially avoiding a deformation of the reticle during the scanning period (i.e. the period wherein the image is projected onto the substrate).

In a preferred embodiment of the present invention, the desired clamping force to hold the object is provided entirely by the actuators. In such an arrangement, the holding device comprising the vacuum pads can be omitted. In such an arrangement, the clamping can be provided by actuators arranged to clamp the object directly or indirectly to the object table.

Although the following embodiments will mainly focus on the clamping of a reticle, it should be noted that the apparatus as described may also be applied to clamp other objects.

Figure 3A:
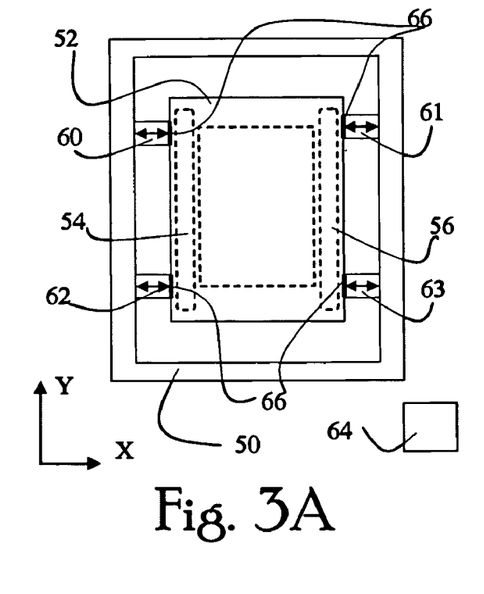
FIG. 3a schematically depicts a first embodiment of a stage apparatus according to the present invention FIG. 3b schematically depicts a second embodiment of a stage apparatus according to the present invention.

FIG. 3a schematically depicts a first embodiment of a stage apparatus according to the present invention comprising an object table 50, a reticle 52, two (optional) vacuum pads 54, 56 for clamping the reticle. The vacuum pads are arranged on opposite sides of the reticle and extend in the Y-direction, corresponding to the scanning direction. The arrangement further comprises four piezo-actuators 60, 61, 62, 63 arranged on the reticle sides extending in the Y-direction, the actuators being arranged to exert a force in the X-direction on the reticle. This arrangement enables the generation of an additional clamping force for holding the reticle, the force being proportional to the force generated by the actuators. By applying a voltage (or a charge) over the piezo-actuators, an elongation in the direction of the arrows (see FIG. 3a) can be obtained, thereby clamping the object in such manner that at least part of the inertial force is compensated. The voltage (or charge) applied to the piezo-actuators is controlled by an electronic control unit 64. As such, the voltage or charge can be modified based upon a predefined parameter such as the acceleration of the object. In such an arrangement, the clamping of the object is enabled by clamping the object to (multiple) clamping surfaces 66 of the actuators. It should be noted that the object may also be clamped to a clamping surface of the object table directly.

Figure 3B:
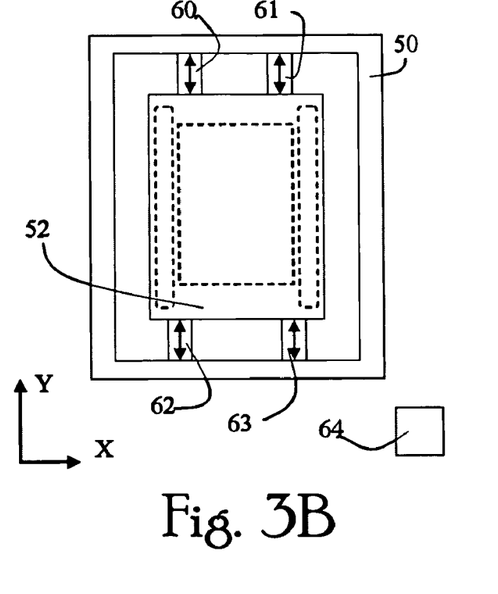

In order to compensate at least part of the inertial force acting on the reticle, it is desirable that the actuator arrangement have a comparatively high stiffness in the Y-direction. Typical values of the desired stiffness are 1e7 to 1e9 N/m FIG. 3b schematically depicts a second embodiment comprising an object 50 and a reticle 52. The arrangement is provided with similar piezo-actuators as in FIG. 3a. In this arrangement, the piezo-actuators 60, 61, 62 and 63 are arranged along the reticle sides extending in the X-direction enabling the actuators to exert a force in the Y-direction.

A benefit of such an arrangement is that the force exerted by the actuators is directly available for compensating the inertial force since both forces act in the same (Y) direction. As a consequence, there are no particular requirements with respect to the stiffness of the actuator arrangement in the Y-direction.

It will be clear that the force for at least partly compensating the inertial force may also be generated using one actuator on one side and two actuators on the other side or by having only one actuator on each side. It may also be sufficient to have one actuator provided on one side of the object, provided that a clamping mechanism is provided to keep the object attached to the actuator, both during acceleration and deceleration (see e.g. FIG. 8b).

Figure 4:
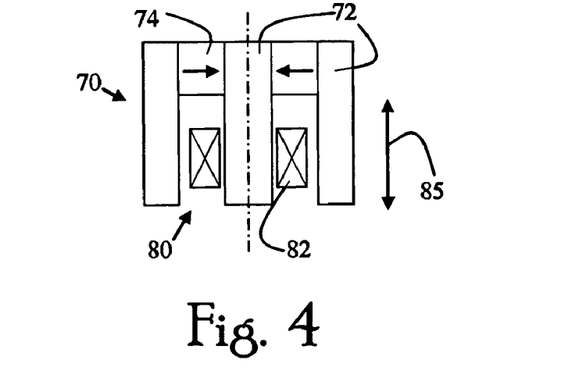
FIG. 4 schematically depicts a cross-section of an electromagnetic actuator.

The first and second embodiments as shown in FIGS. 3a and 3b may also be provided with e.g. Lorentz actuators or voice-coil motors for generating the compensating force. A cross-sectional view of such an actuator is schematically shown in FIG. 4. The actuator shown comprises a first part 70 comprising a ferromagnetic yoke 72 and a permanent magnet 74, the second part 80 comprises a coil 82 arranged in the magnetic field generated by the first part. By energizing the coil, a force can be generated in the direction as indicated by the arrow 85. In order to exert the generated force onto the reticle, either the first part or the second part has be in contact with the reticle. The following figure (FIG. 5) schematically depicts an arrangement for exerting a force generated by an electromagnetic actuator onto a reticle.

Figure 5:
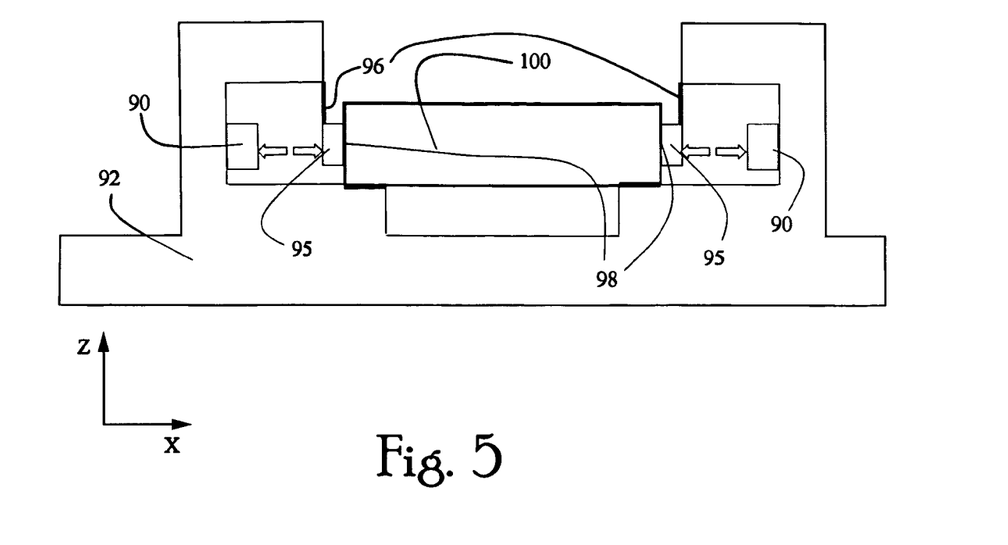
FIG. 5 schematically depicts a third embodiment of a stage apparatus according to the present invention.

In this third embodiment according to the present invention, the first actuator part 90 is substantially rigidly mounted on the object table 92 as indicated, while the second actuator part 95 is mounted to the object table using leaf springs 96 ensuring that the second part can be displaced in the X-direction in case the actuator coil (comprised in either the first part or second part) is actuated. By doing so, the second part can be 'pressed' against the reticle 100 to exert a force on the reticle directed in the X-direction. Note that also in this arrangement, the second part should be mounted to the object table with a comparatively high stiffness to contribute to the compensation of the inertial force. In the arrangement as depicted, the clamping of the object by the actuator is achieved via the clamping surfaces 98 of the actuators.

In order to avoid such construction, the electromagnetic actuators may be arranged to exert a force in the Y-direction directly. The actuators depicted in FIG. 5 can be controlled by an electronic control unit (not shown).

Figure 6:
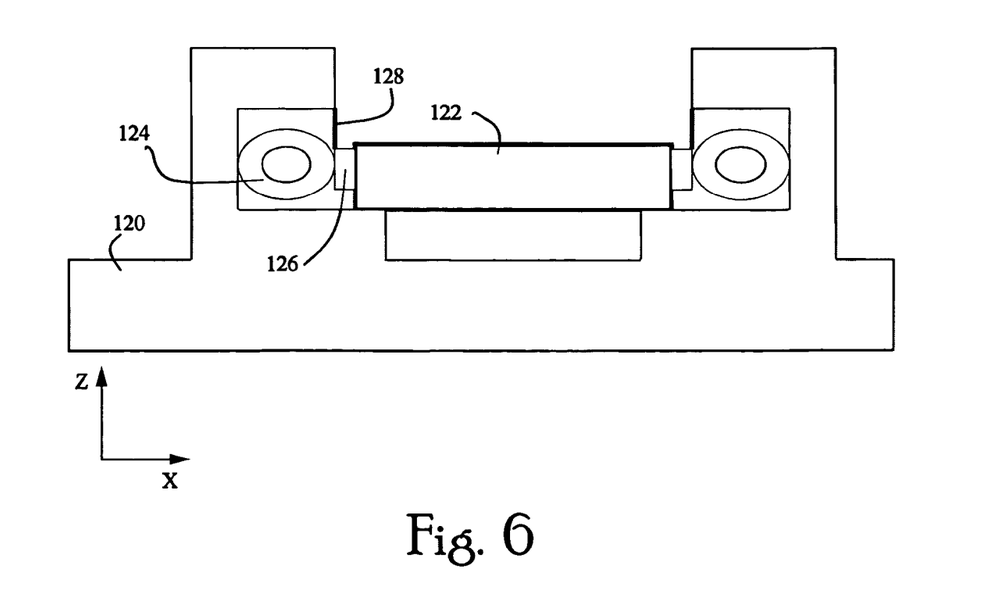
FIG. 6 schematically depicts a fourth embodiment of a stage apparatus according to the present invention.

In a fourth embodiment, the force used to, at least partly, compensate the inertial force is generated using a hydraulic or a pneumatic spring represented by a bellow. FIG. 6 schematically shows an object table 120, an object 122 and a clamping mechanism comprising a bellow 124 arranged to exert a force on the object via a part 126 that is arranged on the object table via a leaf spring 128. In the arrangement as shown, the force is exerted in the X-direction onto the object, the bellows may also be arranged to exert the force in the Y-direction. Part 126 may be, as in the arrangement shown in FIG. 6, a beam for introducing the force into the object to avoid pressure concentrations. The generated force may also be introduced to the object directly, omitting parts 126, 128. The pressure inside the bellow, and therefore the additional force exerted on the object, can be controlled by a control unit based on a predetermined parameter such as the acceleration of the object. In such an arrangement, an hydraulic system may be preferred over a pneumatic system due to the inertia in a pneumatic system to provide a volume change that can result in the exerted force. The bellow pressure can be controlled by an electronic control unit (not shown).

Figure 7:
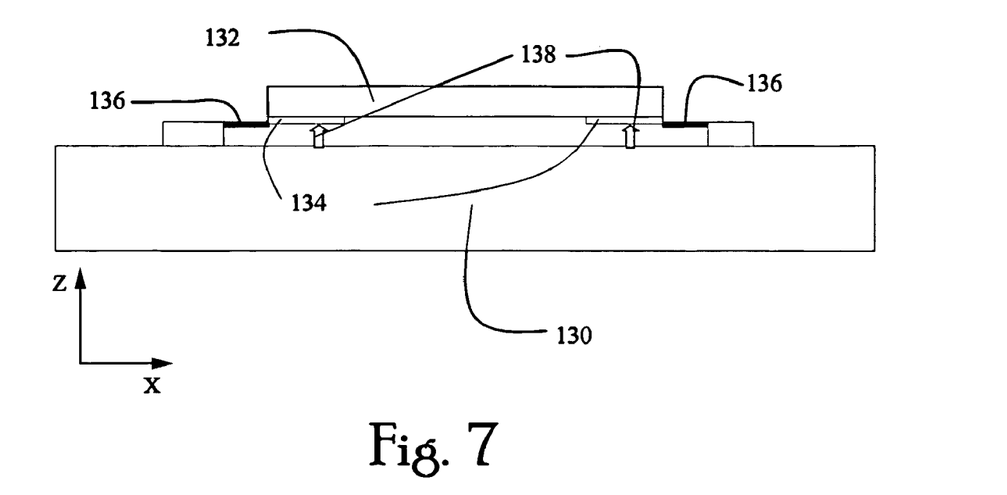
FIG. 7 schematically depicts an embodiment of the present invention wherein the vacuum pads are mounted to the object table via a flexible member.

In an embodiment of the present invention, the arrangement comprises a holding device comprising one or more vacuum pads that are mounted to the object table via a flexible member. Such a member may comprise leaf springs as is illustrated in FIG. 7. FIG. 7 schematically depicts an object table 130 and an object 132 that is held relative to the object table using vacuum pads 134, the vacuum pads being arranged on the object table via leaf springs 136. Such an arrangement may be applied to hold an object such as a reticle. Due to the flexibility of the connection, a possible deformation of the object that is held is avoided or at least mitigated. In the arrangement as shown, a reticle is clamped using vacuum pads while the vacuum pads are mounted to the object table using two leaf springs extending in the scanning direction (Y-direction). This orientation of the leaf springs provides a comparatively flexible connection in the Z-direction while providing a comparatively high stiffness connection in the Y-direction, the latter enabling the reticle to maintain its relative position to the object table during acceleration. The embodiments as described in FIGS. 2a to 6 may be applied in combination with the manner of holding the reticle as described in FIG. 7. When the additional holding force is introduced in a plane parallel to the reticle surface, the comparatively low stiffness can be maintained in the Z-direction. In order to position the object in the Z-direction, the vacuum pads can be supported by supports provided on the object table (schematically depicted by the arrows 138 in FIG. 7). It should also be noted that the object can also be clamped using electrostatic or electromagnetic forces rather than using vacuum pads. Such an arrangement may be applied in a vacuum environment as in a lithographic apparatus using EUV radiation. In order to increase the desired holding force, a combination of vacuum pads with electrostatic clamping can also be applied.

Figure 8A:
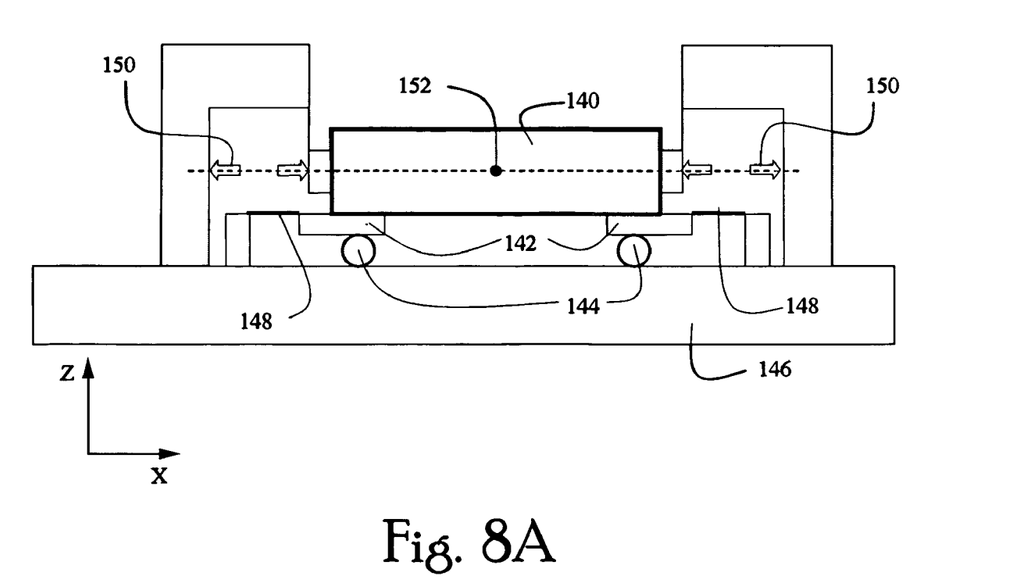
FIG. 8a schematically depicts a fifth embodiment wherein the additional clamping force is directed substantially through the center of gravity of the object that is held.

In a preferred embodiment, the additional clamping force is directed substantially through the center of gravity of the object that is held. By doing so, the generation of a torque exerted on the object can be avoided or at least mitigated. Such a torque exerted on the object could cause a deformation of the object or could adversely affect the clamping by the vacuum pads. Such an arrangement is obtained by arranging the actuators or clamping arrangement at the appropriate location about the object such that the line of action of the additional force is directed substantially through the centre of gravity. This is schematically illustrated in FIG. 8*a*. FIG. 8*a* schematically depicts a fifth embodiment similar to the embodiment of FIG. 5 combined with the leaf spring arrangement of FIG. 7. The object 140 is held using vacuum pads 142 that are supported by the supports 144, the vacuum pads are connected to the object table 146 via leaf springs 148. The line of action of the additional holding force 150 (e.g. provided by an electromagnetic or a pneumatic actuator) is directed substantially through the center of gravity 152 of the object 140.

Figure 8B:
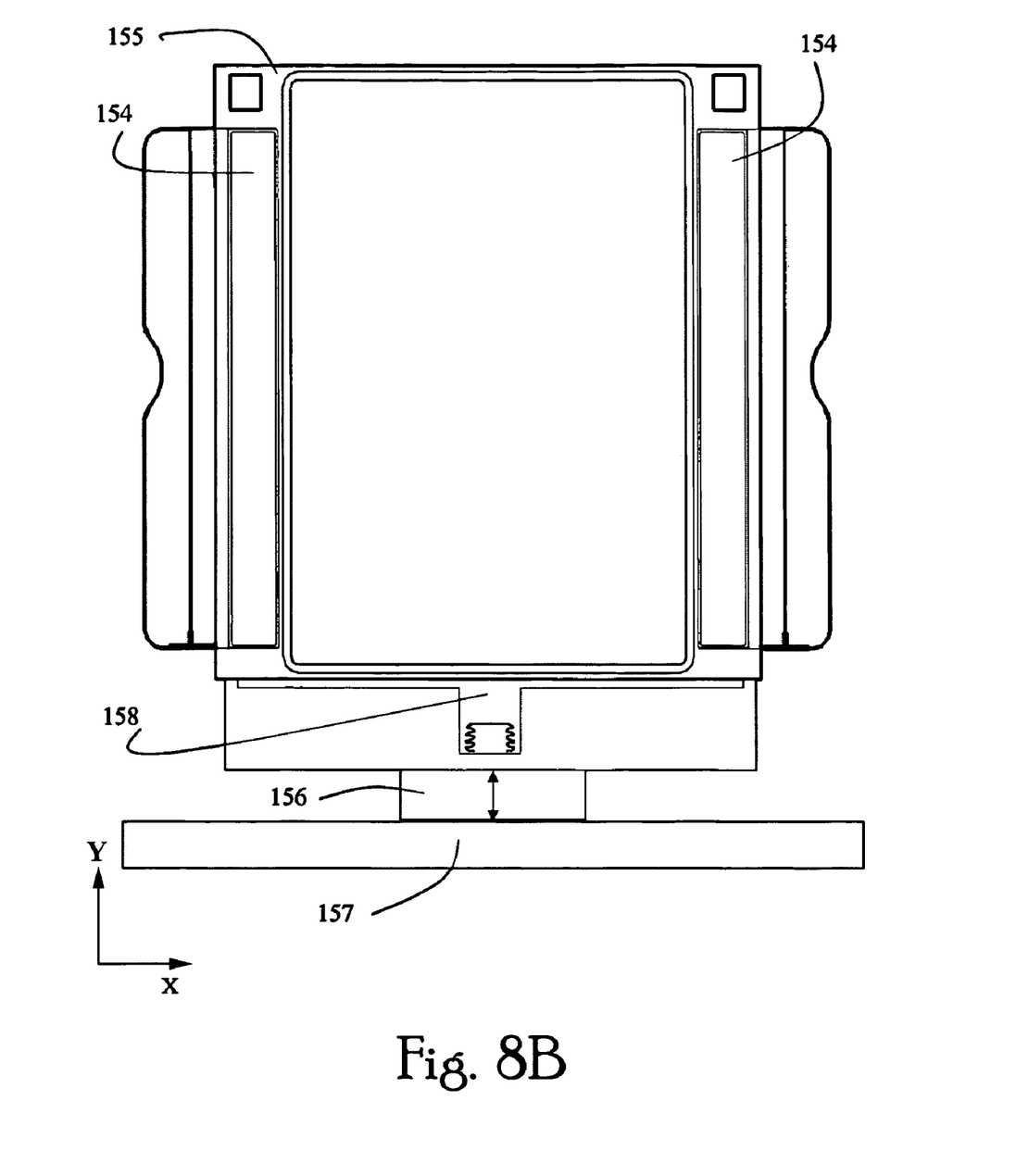
FIG. 8b schematically depicts a sixth embodiment comprising an actuator that is mounted to the object using a vacuum clamp.

The additional clamping force may also be provided on one side of the object, as shown in FIG. 8*b*. The sixth embodiment shown in FIG. 8*b* depicts an XY-view of an object 155 clamped on two vacuum pads 154. On one side of the object, there is provided an actuator 156 for exerting a force in the Y-direction onto the object. The actuator is on one side mounted to the object table 157 and on the other side to the object using a vacuum clamp 158. By clamping the actuator to the object, one actuator on one side is sufficient to provide both compensation forces during acceleration of the object and during deceleration. Also in this arrangement, the line of action of the actuator force is preferable directed through the center of gravity of the object. The actuators can be controlled by an electronic control unit (not shown).

The additional force that at least partly opposes the inertial force can also be directed substantially through the center of gravity in another manner. In case a clamping force is provided perpendicular to the object surface and exerted on both sides of the object, the resulting force can be directed substantially through the center of gravity, provided that the stiffness between the object table and the clamping members on each side of object is substantially equal for both members. This principle is schematically shown in FIGS. 9*a* and 9*b*.

Figure 9A:
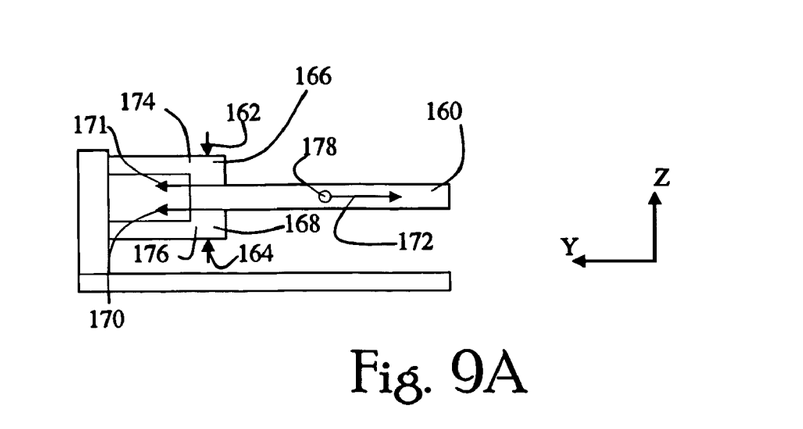
FIGS. 9a and 9b schematically depict the compensation of an inertial force by clamping perpendicular to the object's surface.
Figure 9B:
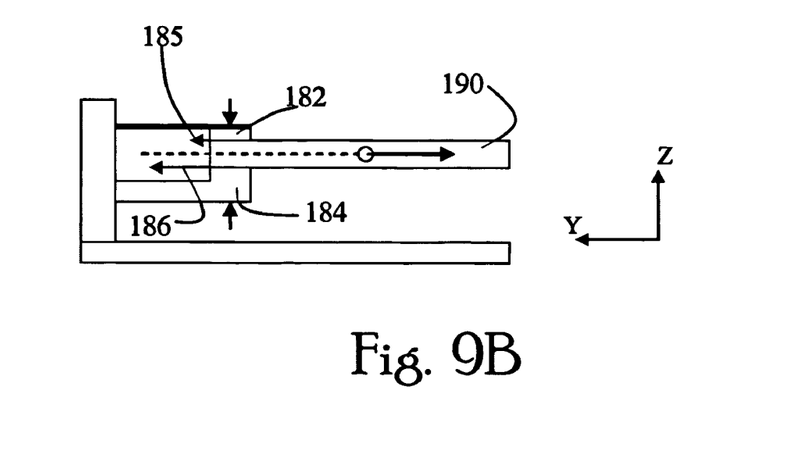

FIG. 9*a* schematically shows a substantially flat object 160 clamped on both sides in a direction perpendicular to the surface of the object. The clamping forces are depicted by the arrows 162 and 164. Due to the friction between the clamps 166 and 168 and the object, the clamping forces may result in two force components 170 and 171 that at least partly compensate the inertial force 172. In case both components are of equal amplitude and the clamping occurs on two positions that are symmetrical with respect to the center of gravity, the resulting force (i.e. the sum of forces 170 and 171) will be directed substantially through the center of gravity 178. It should be noted that the above only holds in case the clamping members 174 and 176 have substantially the same stiffness with respect to the object table in the direction of the inertial force. In case the stiffness of both clamping members 182, 184 is different (FIG. 9*b*), the force components 185, 186 opposing the inertial force will be different. As a consequence, the resulting force may not be directed through the center of gravity. As a consequence, a resulting torque may act on the object 190 that can cause an unwanted deformation of the object. The effects of this deformation can be mitigated by controlling the force exerted on the object such that the additional clamping force is removed or reduced during the exposure step.

Figure 10:
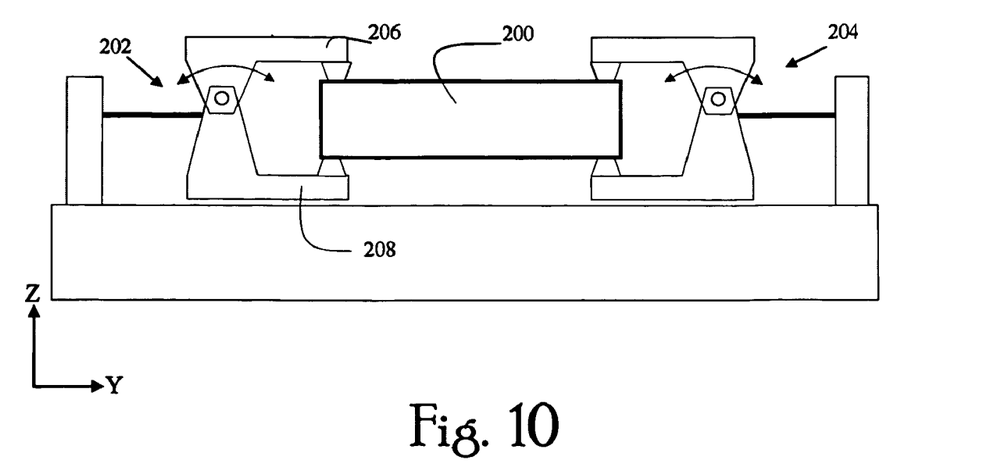
FIG. 10 schematically depicts a seventh embodiment wherein the object is clamped perpendicular to the object's surface.

An example of an arrangement wherein an object is clamped from both sides perpendicular to its surface is shown in FIG. 10. FIG. 10 schematically depicts an object 200 clamped by two clamps 202 and 204, each clamp being provided with two clamping members 206, 208 having substantially the same stiffness with respect to the object table in the scanning direction (Y-direction). In order to clamp the object (and release it), one of the clamps can be rotated as indicated by the arrow. This rotation can be realized using an actuator (not shown). The arrangements as shown in FIGS. 9*a* to 10 can also be combined with a holding device comprising e.g. vacuum pads.

Figure 11:
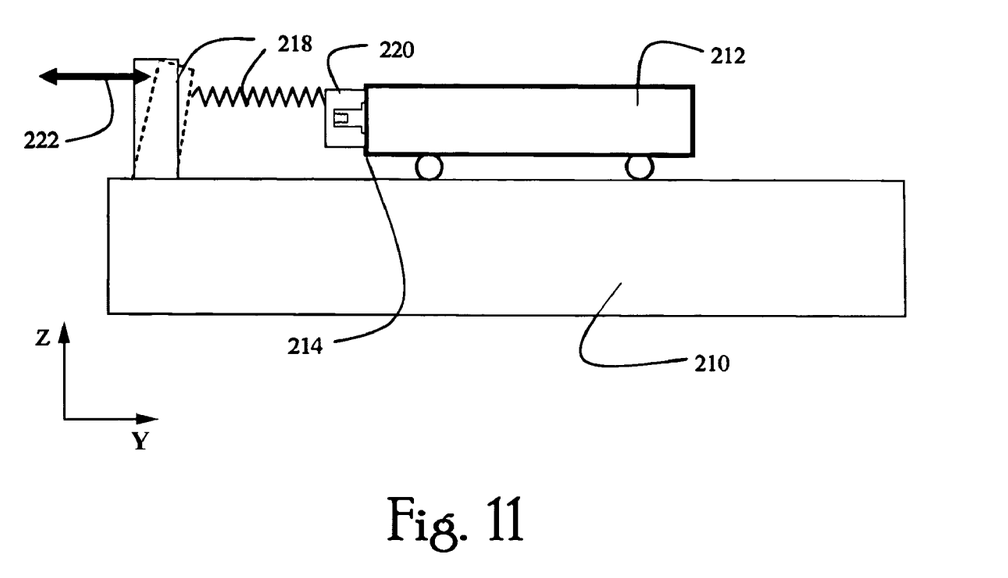
FIG. 11 schematically depicts an eight embodiment comprising a flexible member mounted on the object table for exerting an additional force on the object.

FIG. 11 schematically depicts an eight embodiment of the present invention. FIG. 11 schematically shows an arrangement comprising an object table 210 and an object 212 supported on the object table. The arrangement further comprises a flexible member 218 mounted on the object table, the flexible member being connectable to the object using a vacuum clamp 220. The flexible member is further arranged to receive an actuator force (indicated by the arrow 222). The actuator force may result in a deformation of said flexible member in the Y-direction thereby transferring said actuator force to said object (via said flexible member). The actuator force can be provided by an actuator controlled by an electronic control unit (not shown).

According to the present invention, the additional clamping force can be applied to the object to increase the clamping in case of an acceleration or deceleration of the object. The additional force generated for at least partly compensating the inertial force is therefore not applied continuously. Rather, the additional force is exerted on the object in case the holding force of the object is insufficient to hold the object. This situation may occur during (part of) the acceleration period, i.e. the time period before and after the actual scanning operation. By only exerting the additional force during the acceleration period or a part thereof, deformation of the object due to the additional force is avoided during the scanning period (or constant velocity period).

In an embodiment of the present invention, the force requirements for the actuator are based upon a state of the object. As an example, the force requirement can be predetermined based on the trajectory to be followed by the object. This trajectory can be described using e.g. the position requirement or velocity requirement, acceleration requirements, . . .

In such an arrangement, the trajectory description can be used to generate a feed-forward signal for controlling the actuator that provides the additional clamping force. The feed-forward signal can also be derived from the control signal for controlling a drive unit for positioning the object table or can even be the same.

The apparatus may also be equipped with a sensor for measuring a state of the object (e.g. position or acceleration), said sensor providing input to the control unit that controls the actuator providing the additional clamping force.

In a further embodiment, the feed-forward signal is used to control an electromagnetic actuator such as a Lorentz actuator or a voice-coil actuator. In case the object table is also driven by an electromagnetic actuator, both actuators can be powered by a common power source.

In a further embodiment, a coil of the electromagnetic actuator that provides the additional clamping force and a coil of the actuator that provides a driving force of the object table are connected in series or in parallel. By doing so, the additional clamping force will be substantial during acceleration of the object table and will be substantially zero during the scanning trajectory because the force requirement of the object table during the scanning trajectory is substantially zero.

It should be noted that in case the additional force is introduced substantially parallel to the Y-direction (i.e. the direction in which the object accelerates), the additional force may directly counteract (at least part of) the inertial force. In case the additional force is substantially directed in a non-scanning direction, the effectiveness of the inertial force compensation may depend on the friction between the component exerting the force on the object and on the stiffness of the arrangement between the object table and the object (e.g. the actuator)

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

It should also be noted that alternative methods of clamping can be provided instead of the vacuum clamping described. As an example, the object can be clamped using electrostatic or magnetic forces combined with a controlled actuator system (for providing the additional force) as described in the various embodiments. Such an embodiment may be applied in vacuum applications (e.g. a lithographic apparatus using an EUV light source)

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A stage apparatus for displacing an object having a substantially flat surface, comprising:
   an object table configured to support said object;
   a positioning device configured to displace the object table in a first direction wherein the object table is provided with a clamping device configured to clamp the object by a first clamping force,
   wherein the first clam in force is controllably adjustable by a control unit during displacement of the object table based upon a state of the object.

2. A stage apparatus according to claim 1, wherein the clamping device comprises an actuator configured to apply said first clamping force.

3. A stage apparatus according to claim 2, wherein the object is clamped to at least one clamping surface of the actuator.

4. A stage apparatus according to claim 1, wherein the object is clamped to at least one clamping surface of the object table.

5. A stage apparatus according to claim 1, further comprising a holding device configured to clamp the object by a second clamping force.

6. A stage apparatus according to claim 1, wherein said first clamping force is directed in a plane that is substantially parallel to said surface.

7. A stage apparatus according to claim 1, wherein said state comprises an acceleration set-point of said object table.

8. A stage apparatus according to claim 5, wherein said holding device comprises a vacuum pad congfigured to supply said second clamping force, said vacuum pad being mounted on said object able using a flexible member.

9. A stage apparatus according to claim 8, wherein said flexible member comprises a leaf spring.

10. A stage apparatus according to claim 1, wherein said actuator comprises an electromagnetic actuator, a hydraulic actuator, a pneumatic acuator, or a piezo-electric actuator.

11. A stage apparatus according to claim 10, wherein said control unit and said actuator are arranged to reduce said first clamping force to a predefined force value when the acceleration of the object is smaller than a predefined acceleration value.

12. A lithographic apparatus comprising:
    an illumination system configured to condition a radiation beam;
    a support constructed to support a patterning device, the patterning device configured to impart the radiation beam with a pattern in its cross-section to form a patterned radiation beam;
    a substrate table constructed to hold a substrate;
    a projection system configured to project the patterned radiation onto a target portion of the substrate, and
    a positioning device configured to displace the support in a first direction;
    wherein the support is provided with a clamping device configured to clamp the patterning device by a first clamping force, and wherein the first clamping force is controllably adjustable by a control unit during the displacement of the support based upon a state of the patterning device.

13. A stage apparatus according to claim 1, wherein the object table is a substrate table configured to support a substrate to be illuminated with a radiation beam.

14. A stage apparatus according to claim 1, wherein the object table is a patterning device support configured to support a patterning device.

15. A lithographic apparatus according to claim 12, wherein the substrate table is provided with a clamping device configured to clamp the substrate by a second clamping force, and wherein the second clamping force is controllably adjustable by the control unit during the displacement of the substrate table based upon a state of the substrate.

16. A lithographic apparatus comprising:

an illumination system configured to condition a radiation beam;

a patterning device support constructed to support a patterning device, the patterning device configured to impart the radiation beam with a pattern in its cross-section to form a patterned radiation beam;

a substrate support constructed to hold a substrate;

a projection system configured to project the patterned radiation beam onto a target portion of the substrate;

a positioning device configured to displace one of the supports in a first direction, the support being provided with a clamping device configured to clamp the respective patterning device or substrate by a first clamping force; and a control unit configured to controllably adjust the first clamping force during displacement of the support based upon a state of the respective patterning device or substrate.

17. A lithographic apparatus according to claim 16, wherein the clamping device comprises an actuator configured to apply the first clamping force.

18. A lithographic apparatus according to claim 16, wherein the patterning device or substrate is clamped to at least one clamping surface of the actuator.

19. A lithographic apparatus according to claim 16, wherein the patterning device or substrate is clamped to at least one clamping surface of the support.

20. A lithographic apparatus according to claim 16, further comprising a holding device configured to clamp the patterning device or substrate by a second clamping force.

* * * * *